United States Patent [19]

Ham

[11] Patent Number: 5,576,122
[45] Date of Patent: Nov. 19, 1996

[54] PHASE SHIFT MASK AND MANUFACTURING METHOD THEREOF

[75] Inventor: Young M. Ham, Kyoungki-do, Rep. of Korea

[73] Assignee: Hyundai Electronics Industries Co., Ltd., Rep. of Korea

[21] Appl. No.: 331,728

[22] Filed: Oct. 31, 1994

[30] Foreign Application Priority Data

Oct. 29, 1993 [KR] Rep. of Korea ............... 93-22679

[51] Int. Cl.$^6$ ........................... G03F 9/00
[52] U.S. Cl. .................. 430/5; 430/311; 430/312; 430/313
[58] Field of Search ................ 430/5, 311, 312, 430/313

[56] References Cited

U.S. PATENT DOCUMENTS 5,130,263  7/1992  Possin et al. ................... 430/5
5,380,609  1/1995  Fujita et al. ................... 430/5

Primary Examiner—S. Rosasco
Attorney, Agent, or Firm—Merchant, Gould, Smith, Edell, Welter & Schmidt

[57] ABSTRACT

A phase shift mask and a manufacturing method thereof are disclosed. To overcome problem that a photoresist film at an area unexposed to the light is removed by a certain thickness when the conventional half-tone phase shift mask is used for the formation of a photoresist film pattern, the phase shift mask comprises: a lower non-transmissionable film and a phase shift film laminated on a predetermined area unexposed to the light on a transparent substrate, the lower non-transmissionable film having a predetermined light-transmission degree; and an upper non-transmissionable film formed on the phase shift film.

7 Claims, 3 Drawing Sheets

PHASE SHIFT MASK AND MANUFACTURING METHOD THEREOF

BACKGROUND OF THE INVENTION

1. Field of the Invention

The present invention relates to a phase shift mask and a manufacturing method thereof, and more particularly, to a half-tone phase shift mask and a manufacturing method thereof which enables only a predetermined portion of exposed light to pass therethrough.

2. Description of Prior Art

Semiconductor devices have had a tendency to be light, thin, short, and small, and consequently, the sizes of unit elements thereof such as transistors and capacitors have also come to be small, so that the patterns thereof are accelerated to be fine and precise.

Generally, in a light emitting mask which is used in a light emitting process to form a pattern, a non-transmissionable film such as chrome is deposited on a quartz substrate, and then a non-transmissionable pattern is formed by ion beam etching. However, it is difficult to form a fine pattern lower than the light resolution ability by the above light emitting mask, and it is impossible to achieve a fine pattern lower than 0.5 μm by conventional photoresist films and with light emitting equipment currently in common use.

Further, ultra high-integrated elements above 64 DRAM require a finer pattern lower than 0.4 μm, the formation of which is realized by a phase shift mask which enables the formation of a photoresist film of high resolution.

FIG. 1 is a sectional view of a conventional half-tone phase shift mask 10, which is widely and commonly used because the manufacturing process of the mask is relatively simple and the resolution of the mask is high, and because the manufacturing redundancy thereof is high. In manufacturing a half-tone phase shift mask 10, a thin chrome film 13 and a phase shift film 15 are first laminated on a transparent substrate 11 such as quartz substrate, and a photoresist film pattern, which is not shown, is formed thereon. A pattern is then formed by etching the predetermined light-exposed portions of the chrome film 13 and the phase shift film 15. Lastly, the photoresist film is again removed.

In this case, it is significant that the thin chrome film 13 must be formed in such a manner that only 5 to 15% of the incident light can transmit therethrough, and it is very difficult to achieve the required light transmission degree thereof. When the degree is 10% higher than the predetermined degree, an undesired pattern is formed.

FIG. 2 is a diagram showing the distribution of light passed through the above half-tone phase shift mask when the transmission degree is 10% higher than a predetermined degree, in which a portion 1 in which the intensity of the light is high is an area exposed to the light, another portion 5 in which the intensity of the light is low is another area unexposed to the light, and another portion 3 in which the intensity of light is zero is a boundary area between the areas exposed and unexposed to the light.

When the photoresist film 17 applied on the substrate 12 is exposed to the light in accordance with the light distribution shown in FIG. 2 and then is developed, the photoresist film pattern is formed as shown in FIG. 3. That is, the photoresist film applied on an area unexposed to the light is exposed to a light having a low energy, and the photoresist film in the area exposed to the light is thereby removed in the developing process.

As described above, as the photoresist film of the area unexposed to the light is removed by a certain thickness, a serious problem can be encountered in progressing the manufacturing process of the ultra high integrated semiconductor device.

Also, in manufacturing the conventional half-tone phase shift mask, the vapor deposition of the chrome is carried out in order to adjust the light transmission degree of the chrome film, and then the chrome is etched by a certain thickness. However, it is very difficult to obtain the desired light transmission degree with this method.

SUMMARY OF THE INVENTION

The present invention aims to overcome the above described problem, that is, when a photoresist film at an area unexposed to the light is removed by a certain thickness. Accordingly, an object of the present invention is to provide a half-tone phase shift mask and a manufacturing method thereof, which has a chrome film of thin thickness at the upper portion of the conventional half-tone phase shift mask.

To achieve the above object, the present invention provides a half-tone phase shift mask comprising:

a lower opaque film and a phase shift film deposited on a predetermined area unexposed to the light on a transparent substrate, the lower opaque film having a predetermined light-transmission degree; and an upper opaque film formed on the phase shift film.

To achieve the above object, the present invention further provides a manufacturing method of a half-tone phase shift mask comprising the steps of:

depositing a lower opaque film and a phase shift film on a face of a transparent substrate, the opaque film having predetermined light transmission degree, and etching the phase shift film and opaque film at a predetermined area exposed to the light to expose the transparent substrate;

coating a negative photoresist film on the phase shift film;

exposing the photoresist film to the light by emitting the light from a lower surface of the transparent substrate;

removing the photoresist film unexposed to the light through the developing process;

forming a photoresist film pattern by etching the entire surface of the photoresist film remaining in the area exposed to the light, a part of which overlaps a phase shift film pattern near the area exposed to the light;

vapor-depositing an upper opaque film on the photoresist film pattern and the phase shift film; and removing the photoresist film pattern and the opaque film thereon to form an upper opaque film pattern having an area exposed to the light larger than that of the phase shift film.

BRIEF DESCRIPTION OF THE DRAWINGS

The above object and other advantages of the present invention will become more apparent by describing in detail the preferred embodiment of the present invention with reference to the attached drawings, in which.

DETAILED DESCRIPTION OF THE PREFERRED EMBODIMENT

Hereinafter, a half-tone phase shift mask and a manufacturing method thereof according to the present invention will be described in detail with reference to the accompanying drawings.

Figure 4:
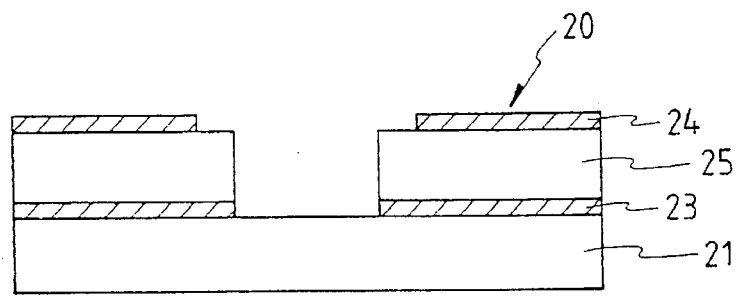
FIG. 4 is a cross-sectional view of a half-tone phase shift mask in accordance with the present invention.

FIG. 4 is a cross-sectional view of a half-tone phase shift mask 20 in accordance with the present invention. A chrome film 23 and a phase shift film 25 pattern are formed on a transparent substrate such as a quartz 21 such as in the conventional mask, and on the upper side of the phase shift film 25 a chrome film 24 is formed, the chrome film not being formed at the boundary face between the areas exposed and unexposed to the light. In this case, the width of a portion on which the chrome film 24 is not formed is made to be such that the intensity of the light by the interference between a phase-shifted light passed through the phase shift film 25 and a light passed through the quartz substrate 21 is minimized.

The chrome film 23 is formed to have such thickness that 5 to 15% of incident light in emission of the light can pass therethrough, and the chrome film 24 is formed to have such thickness that the light is completely-insulated, such as thickness higher than 1000 Å. Other opaque material can be used instead of the chrome film.

Further, a common material is used for the phase shift film 25.

FIGS. 5A through 5E are sectional views respectively illustrating sequential steps of a process for manufacturing a half-tone phase shift mask in accordance with the present invention.

Figure 5A:
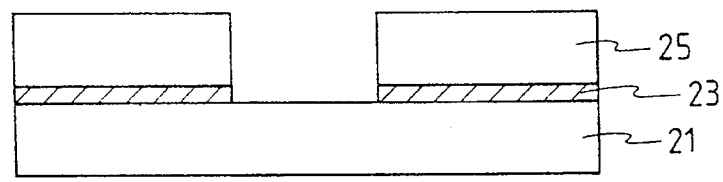
FIGS. 5A to 5E are cross-sectional views respectively illustrating sequential steps of a process for manufacturing a half-tone phase shift mask in accordance with the present invention.

First, a chrome film 23 and a phase shift film 25 are laminated on a transparent quartz substrate 21, and then the chrome film 23 and the phase shift film 25 in an area exposed to the light are etched by a known technique so that a pattern is formed, as shown in FIG. 5A.

Figure 5B:
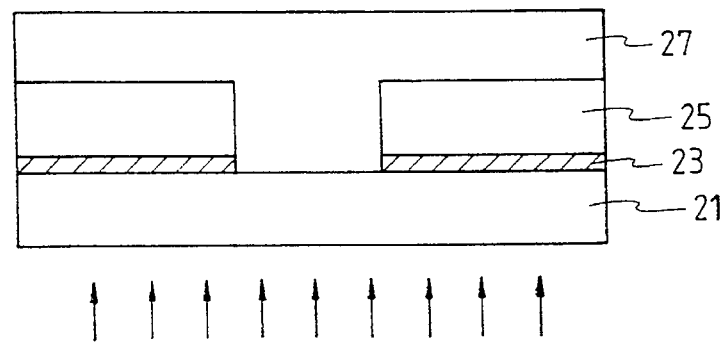
Figure 5C:
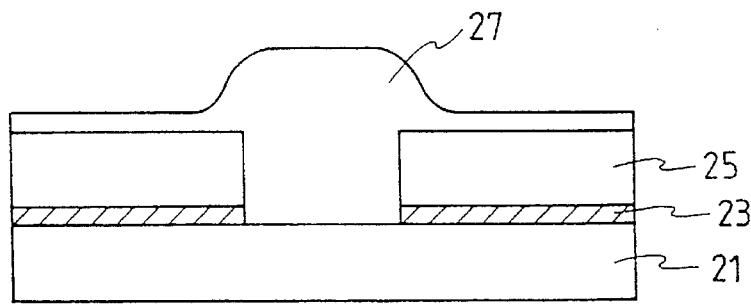

Then, a negative-type photoresist film 27 is applied on the quartz substrate 21 and the phase shift film 25, and the photoresist film 27 is exposed to the light incided from the rear face of the quartz substrate 21 through the quartz substrate the chrome film 23, and the phase shift film 25, as shown in FIG. 5B.

Figure 1:
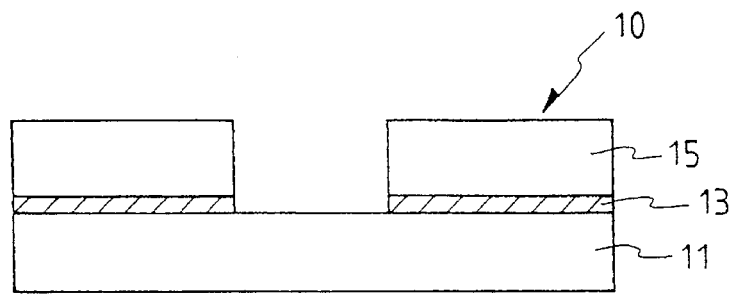
FIG. 1 is a cross-sectional view of a conventional half-tone phase shift mask.
Figure 2:
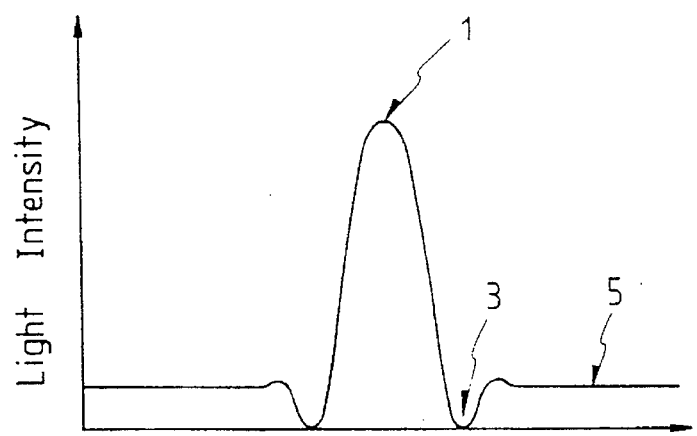
FIG. 2 shows the distribution of the intensity of the light transmitted through the half-tone phase shift mask of FIG. 1.
Figure 3:
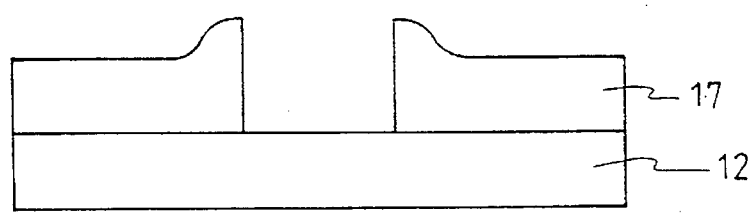
FIG. 3 is a cross-sectional view of the photoresist pattern formed by the exposure and development proceeses using the phase shift mask of FIG. 1.

By this way of light emission, the negative photoresist film 27 is exposed to the light in accordance with a light distribution as shown in FIG. 2.

The photoresist film 27 unexposed to the light is removed in the following developing process, and then the photoresist film 27 with a certain thickness remains not only in an area exposed to the light but also in the other area unexposed to the light.

Figure 5D:
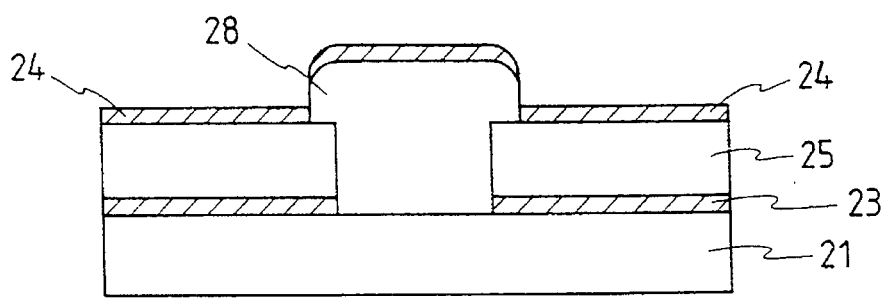

Then, the photoresist film 27 is etched by an entire surface etching method until the phase shift film 25 is exposed, so that only the photoresist film 27 remains in the area exposed to the light, and a photoresist film pattern 28 on which the photoresist film 27 is overlapped is formed at the boundary face between the areas exposed and unexposed to the light, and then a chrome film 24 is vapor-deposited, as shown in FIG. 5D. In this case, it is not easy for the chrome film 24 to be vapor-deposited on the side walls of the photoresist film pattern 28.

Figure 5E:
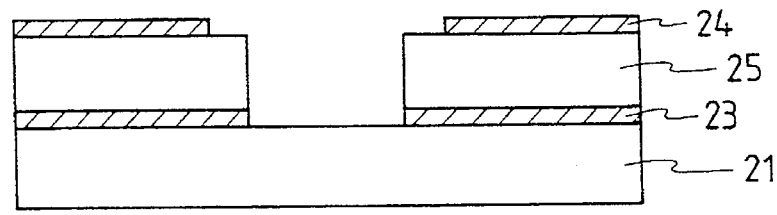

Then, the photoresist film pattern 28 is removed by wet-etching, and chrome film 24 thereon is also removed by itself accordingly, as shown in FIG. 5E. In this case, a half-tone phase shift mask 10 is completed, wherein the quartz substrate 21 in the area exposed to the light is exposed, and the phase shift film 25 at the boundary face between the areas exposed and unexposed to the light is exposed.

According to the half-tone phase shift mask according to the present invention as described above, the thickness of the chrome film formed under the phase shift film can be regulated freely, and an advantage is provided thereby in that the manufacturing process of the half-tone phase shift mask is simple. Also, a further advantage exists in that the yield and the reliability of the semiconductor device is improved because a precise pattern can be formed owing to the minimization of the light intensity at the edge portion of the area exposed to the light.

What is claimed is:

1. A half-tone phase shift mask comprising:
   a lower opaque film and a phase shift film deposited on a predetermined area unexposed to the light on a transparent substrate forming raised portions comprising the lower opaque film and the phase shift film above the transparent substrate and leaving portions of the transparent substrate exposed, the lower opaque film having a partial light-transmission degree; and
   an upper opaque film formed on the phase shift film substantially covering the phase shift film, wherein edges of an upper surface of the raised portions remain exposed, forming a strip of exposed phase shift film surrounding the upper opaque film on the upper surface of the raised portions, wherein the strip of the exposed phase shift film is adjacent the exposed portions of the transparent substrate.

2. A half-tone phase shift mask as claimed in claim 1, wherein the upper opaque film is formed in such a manner that a portion of the phase shift film at a boundary face between areas of the transparent substrate exposed and unexposed to the light is exposed.

3. A half-tone phase shift mask as claimed in claim 1, wherein the opaque film is made of a chrome film or an aluminum film.

4. A half-tone phase shift mask according to claim 1, wherein a portion of the transparent substrate is exposed to the light.

5. A half-tone phase shift mask as claimed in claim 4, wherein a portion of the phase shift film bordering around the exposed portion of the transparent substrate is exposed to the light.

6. A manufacturing method of a half-tone phase shift mask comprising the steps of:
   depositing a lower opaque film and a phase shift film on a face of a transparent substrate, the opaque film having a partial light transmission degree, and etching the phase shift film and opaque film at an area exposed to the light to expose a portion of the transparent substrate;
   coating a negative photoresist film on the phase shift film and the exposed portion of the transparent substrate;

exposing the photoresist film to the light by emitting the light from a lower surface of the transparent substrate;

removing the photoresist film unexposed to the light through the developing process;

forming a photosensitive film by etching the entire surface of the photoresist film remaining in the area exposed to the light, a part of which overlaps an upper surface edge of a phase shift film pattern bordering the area exposed to the light;

vapor-depositing an upper opaque film on an upper surface of the photoresist film pattern and the phase shift film; and removing the photoresist film pattern and the opaque film thereon to form an upper opaque film pattern having an area exposed to the light larger than that of the phase shift film, thereby forming a strip of exposed phase shift film on an upper surface of the exposed phase shift film around the portion exposed to the light.

7. A manufacturing method of a half-tone phase shift mask as claimed in claim 6, wherein the opaque film is made of chrome or aluminum.

* * * * *